Aug. 26, 1969 P. O. LAURITZEN 3,463,972

TRANSISTOR STRUCTURE WITH STEEP IMPURITY GRADIENTS HAVING FAST TRANSITION BETWEEN THE CONDUCTING AND NONCONDUCTING STATE

Filed June 15, 1966

INVENTOR.

PETER O. LAURITZEN,

BY Roger L. Browdy & Stuart Lubitz

ATTORNEYS.

United States Patent Office 3,463,972

Patented Aug. 26, 1969

3,463,972

TRANSISTOR STRUCTURE WITH STEEP IMPURITY GRADIENTS HAVING FAST TRANSITION BETWEEN THE CONDUCTING AND NONCONDUCTING STATE

Peter O. Lauritzen, Seattle, Wash., assignor to Fairchild Camera and Instrument Corporation, Syosset, N.Y., a corporation of Delaware Filed June 15, 1966, Ser. No. 557,782
Int. Cl. H01l *11/00, 15/00, 5/00*
U.S. Cl. 317—235 6 Claims

ABSTRACT OF THE DISCLOSURE

Steep impurity gradients are formed in the base and collector regions of a transistor, with the increase in impurity concentration being a function of the distance away from the collector-base junction. Electric fields are thus built into each region, which keep minority carriers at the junction. The transition time between the conducting and nonconducting state of the transistor is substantially reduced, providing a step-recovery characteristic.

This invention relates to a transistor having an extremely fast turn-off time and to a method for constructing such a transistor.

In circuit design, there is commonly a need for transistors having an extremely fast recovery time from saturation to the off condition. Normally, when a transistor is switched off from saturation, collector current passes through a storage phase. During this phase a reverse current flows as a result of the minority carriers which were injected and stored in the vicinity of the base-collector junction during the conduction period. Normally, the transition from the storage phase to cut off is more or less gradual. Such a gradual cut-off characteristic is detrimental to special circuit applications, such as pulse-shaping and harmonic generation.

The above shortcomings have been largely remedied in diodes by a device referred to as the step-recovery diode. Such diodes have been available for a few years and are described in such publications as "A New High-Speed Effect and Solid-State Diode" by J. Moll, A. F. Boff and R. Shen, Digest of Technical Papers, International Solid-State Circuits Conference, pages 50–51 (1960). Broadly, step-recovery diodes employ an impurity profile that creates a built-in electric field which confines the stored charge (minority carriers) to within a small region close to the center of the junction. Thus, after the applied reverse bias sweeps out the minority carriers, the reverse current is terminated in an abrupt manner. To achieve the desired built-in field, it is necessary to carefully control the impurity or resistivity profile. It is also important to obtain a uniform profile across the entire junction cross-sectional area. The desired built-in field results when an impurity profile having a relatively steep resistivity gradient is employed.

One construction which enables the snap-off or step-recovery diode gradient and other requirements to be realized is the well-known mesa diode. The mesa construction enables uniform resistivity profiles to be formed across the entire junction cross-sectional area and enables steep resistivity gradients to be fabricated. The mesa construction, however, when employed as a narrow base-width high-frequency step-recovery transistor, includes a relatively high base resistance, that is, a base region having a resistance in excess of approximately 50 ohms. The existence of such resistance greatly limits the step-recovery operation and, in particular, degrades pulse-shaping and harmonic generation.

This invention provides a transistor having an extremely fast recovery to turn off. Briefly, the structure of the invention comprises a first monocrystalline semiconductor region having a first conductivity type; a second monocrystalline semiconductor region having a conductivity type opposite to the first region and located adjacent to the first region to form a first pn junction; a third monocrystalline semiconductor region having a conductivity type the same as the first region and located adjacent the second region to form a second pn junction, said third region having a resistivity profile in the vicinity of the second junction that creates a predetermined built-in field which concentrates minority carriers in the proximity of the second junction, whereby the transistor has a step-recovery characteristic.

In order to fabricate the above-described transistor, a novel method has been employed. This method comprises forming an inverse mesa on one side of a monocrystalline semiconductor wafer having a first conductivity type; forming a base region in said mesa, which forms a base-collector pn junction with said wafer; removing portions of said inverse mesa to form a relatively flat surface and a uniform base-collector junction; and forming thin stripe-like emitter regions in said base region to form an emitter-base pn junction, whereby a planer-like transistor is formed having a base-collector junction with characteristics similar to a junction formed by mesa techniques. This method enables mesa techniques to be applied to form a junction having a uniform characteristic over the entire area of the junction with the required steep gradient and to provide an emitter construction with low base resistance for high-frequency operation.

The present invention is illustrated in the accompanying drawings, wherein:

FIGS. 1*a*–1*f* illustrate an improved solid-state device at various stages of manufacture in accordance with the method of the present invention;

Figures 1A, 1B, 1C, 1D, 1E, 1F:
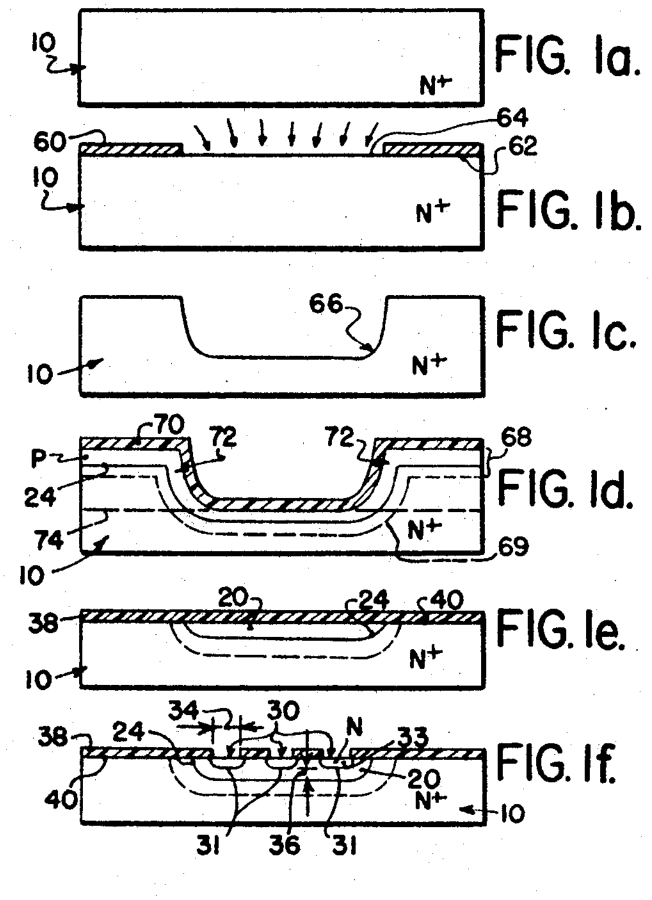

The invented transistor will be first considered in detail along with its operation followed by a method for forming the transistor. Referring to FIG. 1*f*, the transistor comprises a first monocrystalline body 10 which takes the form of a silicon wafer having a first conductivity type (e.g., n-type). Body 10 functions as a collector region. A second monocrystalline region 20 formed adjacent to and within body 10 functions as a base region. The base 20 has a conductivity type opposite to collector 10 (e.g., p-type) which along with collector 10 forms a base-collector junction 24. In the vicinity of the junction 24, the collector region 10 has a steep resistivity gradient. The resistivity gradient in the vicinity of junction 24 must have a value which provides a built-in field sufficient to maintain the minority carriers in a concentrated area at or near the junction. It has been found that built-in fields in the range of approximately 300 to 1,500 volts/cm. are suitable to perform this function. It is preferred that the base region in the vicinity of junction 24 have a similar resistivity gradient. It is preferable, moreover, that the gradient of one of the regions, preferably the base region, be slightly steeper than the collector region. In order for the minority carriers to be in a concentrated area near the junction, the impurity profile is made uniform over the entire area of the junction.

Figure 2:
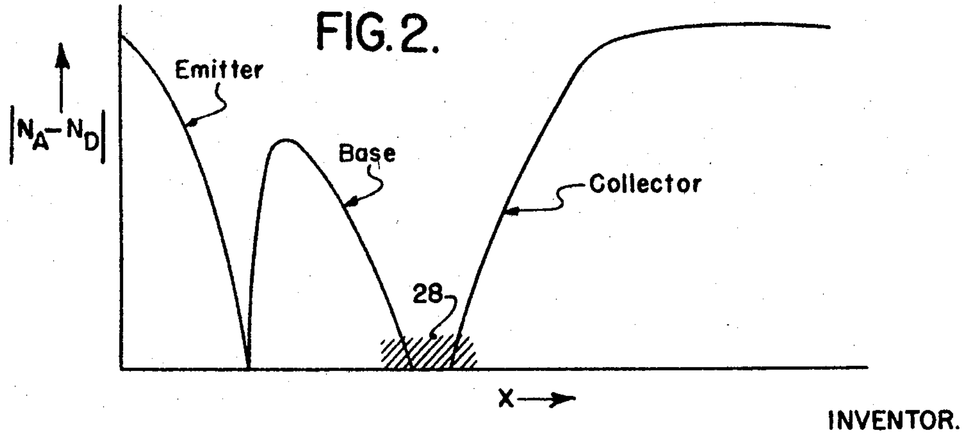
FIG. 2 is a graph of the diffusion profile of the invented device.

The impurity characteristic of the various regions is illustrated in FIG. 2, which shows the absolute value of impurities through the transistor plotted against distance. It is understood in the art that resistivity is inversely related to $|N_A - N_D|$. The purpose of providing the impurity profile shown in FIG. 2 is to develop built-in fields that concentrate the minority carriers in the vicinity of the shaded area 28 (FIG. 2) which is located at or near the center of the base-collector junction. By concentrating the minority carriers in this area, all of the minority carriers stored in the collector and base regions will be removed at the same time. When the carriers stored in the junction area are removed, the transistor switches with a step-recovery characteristic, since there are no excess minority carriers remaining in the collector or base regions which can contribute further current. This step-recovery portion of the cut-off characteristics may be employed in pulse-shaping and harmonic generation. A transistor having such a junction is capable of generating pulses with rise times of less than 0.4 ns. (nanoseconds) when driven by a relatively low-level pulse having a slow rise time (e.g., 1.0 to 6.0 ns.).

The remainder of the device includes a third monocrystalline region 30 having a conductivity type the same as collector 10 (e.g., n-type) and opposite to base 20. Region 30 which functions as an emitter is formed adjacent and within the base 20 to form an emitter-base junction 31. The emitter 30 takes the form of a plurality of very thin continuous or discontinuous stripes which, may have an interdigitated geometry with a width 34 less than 20 microns and preferably about 10 microns. High-frequency operation is achieved by arriving at a relatively low base resistance. The low base resistance is accomplished by the combination of base diffusion processing, the emitter configuration and the emitter depth with respect to the base region. A very small value of dimension 36 is desired, preferably under 1 micron.

A protective layer 38 is formed over the relatively flat surface 40. This protective layer in the case of a silicon wafer may be silicon oxide or any other suitable passivating material. The protective layer 38 extends over junctions 24 and 31. The device is completed by forming contact metallization (not shown) to the emitter 30, base 20 and collector 10. This metallization may be accomplished by a well-known techniques such as described in U.S. Patent No. 2,981,877 issued to R. N. Noyce on Apr. 25, 1961. Following this metallization, the contact leads are attached and the device is encapsulated according to well-known techniques.

Figure 3:
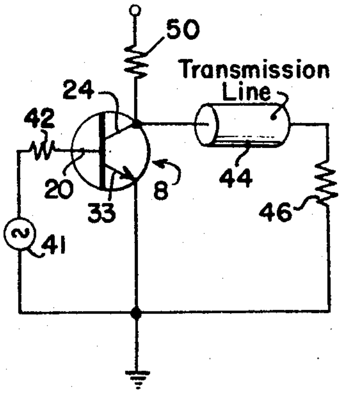
FIG. 3 is a simplified circuit diagram showing the manner in which the invented semiconductor device is employed in a pulse generator.

The operation of the invented transistor can be readily understood by reference to FIG. 3, wherein the transistor is incorporated in a simplified pulse-generating circuit. The invented transistor 8 has an input source 41 connected across its base-emitter junction 31 via resistor 42. A transmission line 44 and resistor 46 are connected across the emitter-collector terminals. A collector biasing source supplies a positive signal to said collector 10 via resistor 50 which has a value approximately equal to the value of resistor 46.

To understand the operation of transistor 8 in the circuit of FIG. 3, it should be recalled that when a switching transistor is driven to saturation, both the emitter-base and base-collector junctions are forward biased. The forward-bias condition of the base-collector junction when switched to cut off results in the base-collector junction experiencing a storage phase followed by a transition phase. The storage phase gives rise to what is generally known as the "storage time" and the transition phase gives rise to what is generally referred to as the "fall or recovery time." In a transistor with the base-collector junction connected to the output load, such as resistor 46, it is the fall time which largely determines the pulse-shaping characteristics of the transistor. In prior art transistors, the fall time was lengthened by the fact that many of the minority carriers injected into the base and collector during saturation slowly return to the collector junction after it has started to switch to the open-circuit condition. Thus, in prior art transistors, a gradual decay of the collector current occurred as the injected minority carriers haphazardly return to the collector.

In operation (assuming transistor 8 is forward biased into saturation), a negative input signal is supplied by input source 41 to base 20 sufficient to drive the transistor 8 to cut off. Now, both base-collector junction 24 and emitter-base junction 31 are reverse biased. The output load 46 is substantially isolated from emitter-base junction 31. Thus, when the base-collector junction is reverse biased, the steep resistivity gradient of the base and collector regions adjacent junction 24 results in a pulse with a rise time as little as 0.4 to 0.5 nanosecond being transmitted to load 46 via transmission line 44. The invented transistor 8 thereby provides an effective pulse-generator or shaper circuit.

In the above description of the invented transistor 8, it should be appreciated that the output load 46 is isolated from the input signal. This isolation is important in pulse-shaping and harmonic generation. In addition, by employing the invented transistor, pulse-shaping or harmonic generation along with pulse power gain may be readily accomplished by using a single device. Finally, the invented device permits relatively slow rise time pulses to be supplied to the emitter-base junction 31 with faster rise time pulses being supplied to the load.

The above-described transistor may be fabricated by the method illustrated in part by FIGS. 1*a*–1*f*. Referring to these figures: As shown in FIG. 1*a*, a wafer 10 containing a p-type or n-type impurity is the starting material. This wafer may be any monocrystalline semiconductor such as silicon with n-type conductivity and low resistivity (e.g., 0.02 ohm-cm.). An inverse mesa is first formed in wafer 10. This may readily be accomplished by well-known photo-engraving etching techniques. For example, a protective layer 60 is formed on the surface 62 of wafer 10 by placing the wafer 10 in an oxidizing atmosphere, whereby a layer of silicon oxide is formed (FIG. 1*b*). Portions of protective layer 60 are then selectively removed to form an opening 64 which exposes a portion of surface 62. This selective removal of protective layer 60 may be accomplished by placing a layer photo-resist over the protective layer 60 and then exposing the photo-resist layer to infrared radiation in the presence of a suitable mask. A subsequent washing of the photo-resist surface removes the unexposed portion of the photo-resist layer, thereby forming opening 64. Next, the exposed portion of surface 62 has an etchant applied which reacts with the monocrystalline semiconductor material (e.g., silicon) but not with the protective layer to form a depression or inverse mesa 66 (FIG. 1*c*).

Once the mesa 66 is formed, the wafer 10 is then cleaned by well-known methods and an epitaxial layer 68 is grown on the surface of the wafer 10 and over the mesa 66 (FIG. 1*d*). The boundary line 69 of epitaxial layer 68 is shown as a broken line as processing of the device results in the boundary being substantially indistinguishable. The methods for epitaxial growth are well known in the art as described in such patent as U.S. Patent No. 3,165,811. The epitaxial layer should be grown with an extremely low impurity concenration of either n-type or p-type (e.g., 8 ohm-cm. n-type). The epitaxial layer is preferably the same conductivity type as wafer 10. A subsequent diffusion of impurities both out-diffused from wafer 10 and from a vapor at the surface into the epitaxial layer 68 is required to form the desired base-collector junction 24 having the required steep resistivity gradient. With the epitaxial layer 68 and base region impurities formed, the wafer 10 is placed in an appropriate environment (atmosphere and temperature) to form an oxide layer 70 over the epitaxial layer 68. A typical example of the conditions for forming the epitaxial growth and base diffusion is as follows: An 8 ohm-cm. n-type epitaxial film is grown in a reactor at 1,200° C. The resultant film thickness is 6 microns. The collector substrate doping is out-diffused into the film at 1,200° C. A boron base predeposition at a slightly lower temperature is followed by the base diffusion at 1,200° C.

Following the formation of the base-collector junction 24 in the inverse mesa, portion 72 of the mesa is removed along the dotted line 74 (FIG. 1*d*) to form a relatively flat surface 40 which extends across the wafer (FIG. 1*e*). The removal of mesa portion 72 may be readily accomplished by a removal operation such as chemical-mechanical polishing. Once the mesa portion 72 is removed, the wafer 10 is again placed in an oxidizing environment resulting in the formation of a protective or oxide layer 38 which covers and protects the base-collector junction 24 (FIG. 1*e*). The formed base-collector junction has a uniform resistivity gradient of the desired profits over its entire area. In addition, the base-diffusion step facilitates the forming of a base region 20 having a relatively low resistance.

Following the formation of the base-collector regions, the emitter regions 30 in the form of thin emitter stripes are fabricated. This may readily be accomplished by well-known photoengraving and diffusion techniques.

In summary, a process has been provided for fabricating the invented device which combines the desirable feature of the mesa technique of forming the base-collector junction with the desirable technique of forming an emitter-base junction by the planar process. The planar construction facilitates metal over oxide contact metallization areas for the various regions.

Although this invention has been described and illustrated with reference to particular applications, the principles involved are susceptible of numerous other applications which will be apparent to persons skilled in the art. The invention is, therefore, to be limited only as indicated by the scope of the appended claims.

What is claimed is:

1. In a transistor comprising a layer of semiconductor material of one conductivity type having an upper and lower surface, a first region of opposite conductivity type located within the layer and forming a first PN junction therewith, the junction having an edge at the upper surface thereof, a second region of the one conductivity type located within the first region and forming a second PN junction therewith, the second junction having an edge at the upper surface, a layer of protective material overlying portions of the upper surface including the surface edges of the junctions to provide protection from contamination, the improvement comprising: the semiconductor layer and the first region each having a steep gradient of impurity concentration with the minimum resistivity of the region being at least an order of magnitude times the minimum resistivity of the layer, said impurity concentration in the layer and region being lowest at the junction between the layer and region and increasing substantially as a function of the distance away from the junction, said layer and first region thereby containing impurity gradients for producing predetermined built-in fields which concentrate minority carriers in the proximity of the first junction and substantially reduce the transition time between the conducting and nonconducting state of the transistor, whereby a step-recovery characteristic is provided.

2. The device as recited in claim 1 further defined by the impurities in the layer being of a single dopant species; and the impurities in the first region being of at least two different type of dopant species, one of the two species being the same as that in the layer, the second of the two species being substantially greater in quantity within the first region compared to the other.

3. The transistor as recited in claim 1 further defined by the rate of increase in impurity concentration in the first region as a function of the distance from the first junction being greater than that of the layer.

4. The device as recited in claim 3 further defined by the maximum impurity concentration in a portion of the layer away from the first PN junction being higher than that in the first region.

5. The device as recited in claim 4 further defined by the maximum impurity concentration in the layer being at least $10^{20}$ dopant atoms per cubic centimeter, and the maximum impurity concentration in the first region being not greater than approximately $10^{18}$ dopant atoms per cubic centimeter, whereby a built-in field in the layer of at least approximately 300 volts per centimeter is created.

6. The structure as recited in claim 5 further defined by the emitter comprising a plurality of stripe-like regions having a width of less than twenty microns and a distance of less than one micron separating the base-emitter junction and the base-collector junctions.

References Cited

UNITED STATES PATENTS

| | | | |
|---|---|---|---|
| 2,810,870 | 10/1957 | Hunter | 317—235 X |
| 2,878,152 | 3/1959 | Runyan | 317—234 X |
| 2,899,434 | 8/1959 | Statz | 317—235 X |
| 3,186,879 | 6/1965 | Schnable | 317—235 X |
| 3,260,624 | 7/1966 | Wiesner | 317—235 X |

JAMES D. KALLAM, Primary Examiner

U.S. Cl. X.R.

29—576; 317—234